Dec. 29, 1970 J. C. ENGEL 3,551,851

CLASS A-B PULSE WIDTH MODULATING AMPLIFIERS

Filed May 27, 1968

WITNESSES:

Bernard R. Giegucz

James F. Young

INVENTOR
Joseph C. Engel
BY
A. Samuel Oddi
ATTORNEY 3,551,851
CLASS A-B PULSE WIDTH MODULATING AMPLIFIERS Joseph C. Engel, Pittsburgh, Pa., assignor to Westinghouse Electric Corporation, Pittsburgh, Pa., a corporation of Pennsylvania
Filed May 27, 1968, Ser. No. 732,174
Int. Cl. H03k 7/08
U.S. Cl. 332—9 5 Claims

ABSTRACT OF THE DISCLOSURE

A pulse width modulated amplifier is disclosed capable of being operated in the class A–B amplifying mode and employing double-edge modulation. In the amplifier, a source of modulating signals is provided which may have, for example, a sawtooth waveform. The sawtooth waveform is respectively clamped to opposite polarities in the two channels of the amplifier. In one channel of the amplifier the input signal thereto and a biasing potential are compared with one polarity of the clamped sawtooth, with the comparison thereof determining the pulse duration of output signals of one polarity. In the other channel of the amplifier, the input signals and a biasing potential are compared with the clamped sawtooth of the other polarity, with the duration of the output pulses being dependent upon this comparison. The output pulses are supplied by switching devices, such as transistors, whose duty cycle is controlled by the comparison in the respective channels of the amplifier.

BACKGROUND OF THE INVENTION

The present invention relates to pulse width modulated amplifiers and, more particularly, to pulse width modulated amplifiers which may be operative in a class A–B amplify mode.

In copending application Ser. No. 696,894 filed Jan. 10, 1968, now abandoned, by same inventor as the present application, a pulse width modulated (PWM) amplifier is disclosed capable of operation in a class A–B amplifying mode. A single-edge modulating technique is utilized in the amplifier of the copending application wherein a pair of modulating waveforms, each having a ramp waveshape (i.e. linearly increasing in time with a short retrace time) are generated 180° out of phase with each other. The ramp modulating waveforms are respectively used in the positive and negative channels of the amplifier wherein each waveform is compared with the input signals to the amplifier and respective biasing potentials. In response to this comparison, control signals of corresponding pulse durations are generated which are utilized to control the duty cycle of a pair of controlled switching devices, such as silicon controlled rectfiers or transistors. In this fashion, a pulse width modulated output is supplied to a load coupled to the switching devices. Respective bias potentials supplied in each of the channels provide a small duty cycle of operation for the switching devices under no input signal conditions and thereby provide a class A–B mode of operation for the amplifier. The ramp modulating waveforms must be substantially 180° out of phase with each other to prevent both of the controlled switching devices from being turned on at the same time and thereby creating a short circuit across the amplifier. It is therefore necessary that the modulating signal generator by synchronized to provide the two ramp waveforms at approximately 180° apart. Moreover, the modulating ramp waveforms must have fast retrace times.

SUMMARY OF THE INVENTION

The present invention broadly provides a pulse width modulated amplifier wherein modulating signals are respectively clamped to permit excursions in opposite polarities to be used as reference signals in a first and second channel of the amplifier. The clamped reference signals are compared with input and biasing signals in the respective channels to provide control signals whose duration is dependent upon the comparison. The biasing signals are utilized to permit class A–B operation of the amplifier, and the control signals are utilized for controlling the output of the amplifier to provide output signals having a time duration corresponding to the control signals.

DESCRIPTION OF THE PREFERRED EMBODIMENT

Figure 1:
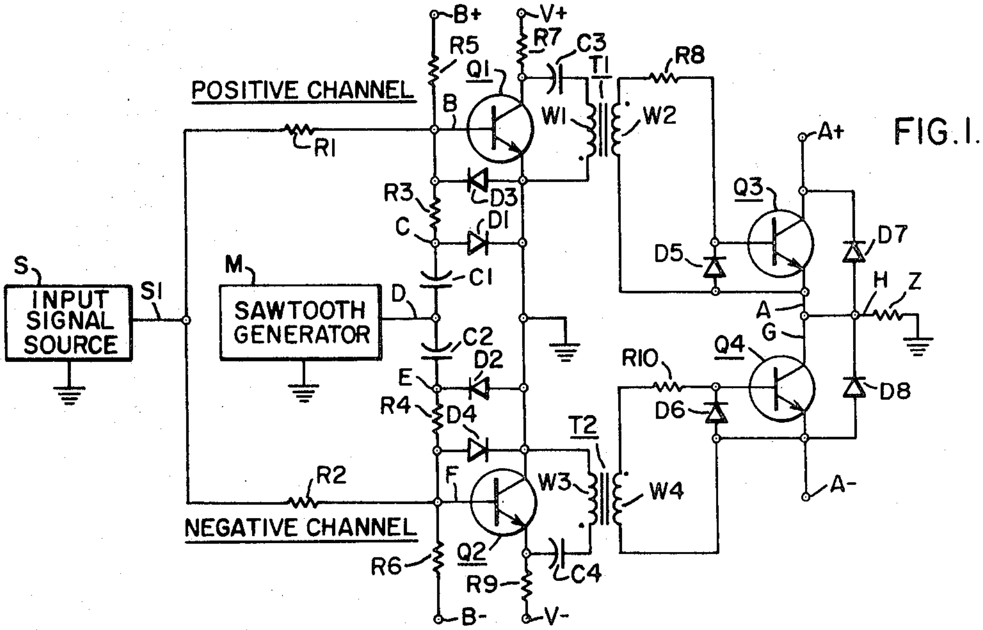
FIG. 1 is a block-schematic diagram of the pulse width modulated amplifier of the persent invention.

In FIG. 1 the PWM amplifier is shown having a positive channel and a negative channel with the channels being supplied by an input signal source S. The input signal source S may supply, for example, audio frequency signals having a sinusoidal waveshape between its output lead S1 and ground. It should be understood, however, that the output of the input signal source S may have various waveforms and frequencies.

The input signals from the lead S1 of the input signal source S are supplied, respectively, via a resistor R1 and a resistor R2 to the base electrode of a transistor Q1 in the positive channel and to the base electrode of a transistor Q2 in the negative channel.

Figure 2:
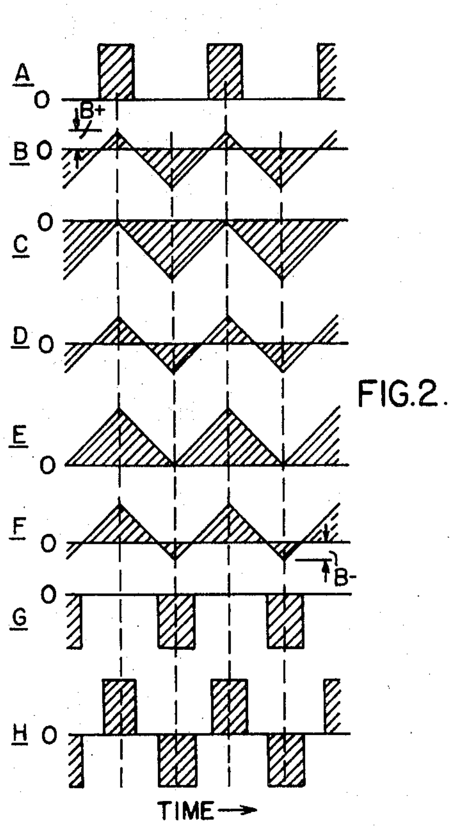
FIGS. 2 and 3 are waveform diagrams each including a set of curves used in explaining the operation of the amplifier of FIG. 1.

A sawtooth generator M is provided which supplies an output waveform D as shown in curve D of FIG. 2. The waveform D is a sawtooth waveform varying about a zero ground reference potential and has a triangular shape as shown in curve D of FIG. 2. In the positive channel a negative clamping circuit including a capacitor C1 and a diode D1 is provided, and in the negative channel a positive clamping circuit including a capacitor C2 and a diode D2 is provided. The capacitor C1 is connected between the point D at the output of the sawtooth generator M and a point C to which the anode of the diode D1 is connected. The cathode of the diode D1 is grounded. The capaictor C2 is connected between the point D and a point E to which the cathode of the diode D2 is connected, with the anode of the diode D2 being returned to ground. Thus the negative clamping circuit C1–D1 clamps the sawtooth waveform D negatively to ground permitting only negative polarity excursions. The waveform at the point C at the anode of the diode D1 is shown in curve C of FIG. 2. Conversely the positive clamping circuit C2–D2 permits only positive excursions of the sawtooth waveform D of this waveform and is shown in curve E of FIG. 2 appearing at the point E at the cathode of diode D2.

The output of the negative clamp circuit C1–D1, as shown in curve C of FIG. 2, is supplied via a resistor R3 to the base of the transistor Q1 at a point B. A diode D3 is connected from anode to cathode between the emitter and base electrodes of the NPN transistor Q1 to protect this junction against excessive reverse voltage and currents. The output of the positive clamping circuit C2–D2, as shown in curve E of FIG. 2, is supplied via a resistor R4 to the base electrode of the transistor Q2 at a point F. A diode D4 is connected from anode to cathode between the base and emitter electrodes of the PNP transistor Q2 to protect this junction.

A positive biasing potential B+ is supplied via a resistor R5 to the point B at the base of the transistor Q1 which is of the NPN type. The negatively clamped waveform of curve C is algebraically added to the positive biasing voltage B+ at the point B to supply a waveform as shown in curve B of FIG. 2 for a no input case, i.e. with no input signals being supplied by the source S. It can be seen from curve B of FIG. 2 that this waveform has a small positive portion thereof having a peak amplitude B+ due to the biasing potential B+ during each cycle of the modulating waveform shown in curve D.

A negative biasing potential B— is supplied via a resistor R6 to the point F at the base of the transistor Q2, which is of the PNP type to be summed with the waveform shown in curve E of FIG. 2. The resulting waveform is shown as at curve F in FIG. 2 and has a negative portion having a peak negative magnitude B— due to the negative bias potential B— during each cycle of the modulating waveform of curve D for the no input signal case. The amount of time that the waveform B is positive and the waveform F is negative can be adjusted by selecting the values of the positive basing potential B+ and negative biasing potential B—, respectively.

A positive operating potential V+ is applied to the collector of the transistor Q1 via a resistor R7. A series circuit including a capacitor C3 and a primary winding W1 of a transformer T1 is connected between the collector and emitter electrodes of the transistor Q1, with the dotted end of the winding W1 being connected to the emitter electrode. During the time period that the transistor Q1 is non-conductive the capacitor C1 will be charged to substantially the V+ potential via the resistor R7. When the waveform B goes positive the base-emitter circuit of the transistor Q1 will be forward biased and the transistor will be rendered conductive with the capacitor C1 discharging through the collector-emitter circuit of transistor Q1 into the dotted end of the winding W1. The transformer T1 includes a secondary winding W2 which has its dotted end connected via a resistor R8 to the base electrode of an output transistor Q3. The undotted end of the winding W2 is connected to the emitter electrode of the transistor Q3 thereof. Thus with the capacitor C3 discharging into the dotted end of the winding W1, base current is supplied from the dotted end of the winding W2 via the resistor R8 into the base of the transistor Q3 turning on this transistor which is of the NPN type. The collector of the transistor Q3 is connected to a source of positive potential A+ and the emitter electrode thereof is connected via a load impedance Z to ground. The output at the emitter of the transistor Q3 is shown in curve A of FIG. 2 with the duration of this output pulse being equal to the time period that the waveform of curve B is positive to maintain the transistor Q1 in a conduction state. When the transistor Q1 is rendered non-conductive at the time the negatively clamped modulating waveform C goes sufficiently negative, base drive will be removed from the transistor Q3 thereby turning it off and terminating the output pulse as applied to the load impedance Z.

The operation in the negative channel is analogous to that of the positive channel. With the transistor Q2 nonconductive, a capacitor C4, connected to the collector thereof, will charge from a negative operating potential B— via a resistor R9 which is coupled to the collector of the transistor Q2. A primary winding W3 of a transformer T2 is connected between the other end of the capacitor C4 and the emitter of the transistor Q2, with the undotted end of the winding W3 connected to the emitter of the transistor Q2. The transistor Q2 is rendered conductive when the waveform of curve F of FIG. 2 goes negative to forward bias the base-emitter junction of the PNP transistor, Q2. The turning on of the transistor Q2 causes the capacitor C4 to discharge into the dotted end of the winding W3 and through the emitter-collector circuit of the transistor Q2. Due to the dot convention on the transformer T2, current flow is induced out of the dotted end of a secondary winding W4 of the transistor T2 and applied via a resistor R10 to the base of an output transistor Q4 of the NPN type thereby turning this transistor on. The collector of the transistor Q4 is connected to the load impedance Z and the emitter of the transistor Q3, and the emitter electrode of the transistor Q4 is connected to a source of negative potential A—. The turning on of the transistor Q4 essentially clamps the collector thereof at the point G to the A— potential thereby providing a pulse output as shown in curve G of FIG. 2. A current path is thus provided through the load impedance Z in the opposite direction from that provided during the positive half of the operating cycle. This current path is from ground through the load impedance Z and the collector-emitter circuit of transistor Q4 to the A— source.

The transistor Q2 remains conductive as long as the waveform as shown in curve F of FIG. 2 remains negative as determined by the B— potential. When the waveform goes positive under the influence of the positive modulating signal shown in curve E of FIG. 2, transistor Q2 will be turned off thereby terminating base-drive current to the transistor Q4 which will thereby be rendered non-conductive. The time duration of the negative output pulse as thus shown in curve G of FIG. 2 is thus determined by the time period that the waveform F of FIG. 2 remains negative. The composite output waveform as seen by the load impedance Z is shown in curve H of FIG. 2 for the no input signal case and is shown to be comprised of positive and negative going pulses whose time durations are dependent, respectively, on the positive and negative magnitudes of the positive biasing potential B+ and the negative biasing potential B— for the no input signal case.

A diode D5 is connected from anode to cathode between the emitter and base electrodes of the output transistor Q3, and a diode D6 is connected from anode to cathode between the emitter and base electrodes of the transistor Q4. The function of the diodes D5 and D6 is to protect the respective base-emitter junctions of these transistors from excessive reverse voltages and currents which would be destructive of the output devices.

The load impedance Z is shown schematically as a resistive load; however, it may include reactive components which may cause reactive load currents to appear as the respective power transistors are turned off. In order to accommodate any reactive currents, a diode D7 is connected from anode to cathode between the emitter and collector electrodes of the transistor Q3, and a diode D8 is connected from anode to cathode between the emitter and collector electrodes of the transistor Q4. The diodes D7 and D8 may comprise fast recovery diodes and are operative to circulate any reactive load current which might be present in the output load circuit back to the power supply supplying the voltages A+ and A—. Thus, as the transistor Q3 is being turned off, the diode D8 would circulate any inductive load current therethrough back to the A— supply, and, when the output transistor Q4 is being turned off, the diode D7 would circulate any inductive load current therethrough back to the A+ supply voltage. The use of the diodes D7 and D8 prevents any destructive voltage transients from being applied across the respective output transistors Q3 and Q4 at the time of being turned off. The load impedance Z may, for example, comprise a loudspeaker, and, in that case, it may be necessary to neutralize the coil thereof by the use of a series resistor and capacitor across the coil to insure the reactive current flow is minimized.

Figure 3:
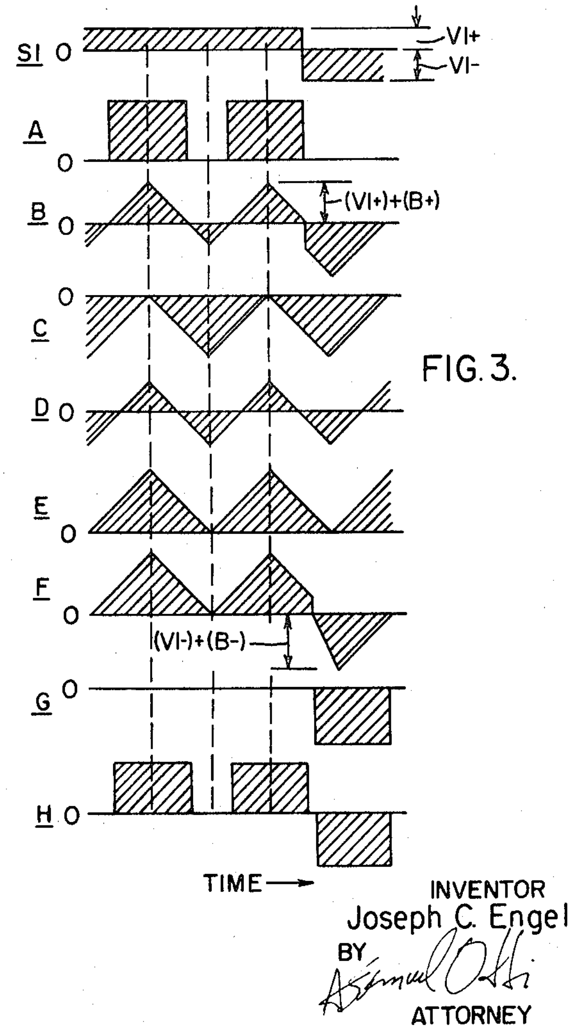

Referring to FIG. 3 the operation of the PWM amplifier in FIG. 1 will be discussed for the case when an input signal is applied thereto such as shown in curve S1 of FIG. 3 wherein the input signal has a positive potential of V1+ for a period of time which then reversed to a negative polarity voltage V1−. It should be noted that the sawtooth modulating waveform appearing in curve D of FIG. 3, the negatively clamped waveform shown in curve C of FIG. 3 and the positively clamped waveform as shown in cure E of FIG. 3 are identical to the respective curves D, C and E of FIG. 2 and remain the same independent of the input signals applied to the amplifier.

The positive signal V1 is supplied through the resistor R1 to the base of the transistor Q1 at the point B. As can be seen in curve B of FIG. 3, the sum of the input signal V1+ and the positive bias voltage B+ at the base of the transistor Q1 causes the waveform to be positive by maximum amount $(V1+)+(B+)$. Therefore, the waveform of curve B is positive for a longer period of time as compared to the no input case. Therefore, the transistor Q1 is conductive for a longer period of time. Curve A of FIG. 3 shows the output pulse of the output transistor Q3 produced in response to the conduction of the transistor Q1. It can be seen from curves A and B of FIG. 3 that both the leading and trailing edge of the waveform of curve A of FIG. 3 are modulated, with leading edge beginning at a time sooner and the trailing edge lasting longer as compared to the no input signal case shown in curve A of FIG. 2.

The input signal voltage of curve S1 of FIG. 3 being positive the sum of the signals at the base of the transistor 32 at the point F is such that the base voltage never goes negative, and therefore, the transistor Q2 is not gated on. Since the transistor Q2 is not turned on the output transistor Q4 is also not turned on. Thus, no output pulse at the point G at the collector of the transistor Q4, as shown in curve G of FIG. 3, is produced. With the input signal S1 remaining positive at the voltage V1+ until two input pulses are provided by the transistor Q3 as shown in curve A of FIG. 3, the output voltage as seen at the load impedance Z will be as shown in curve H of FIG. 3 comprising two positive pulses of the same time duration as the pulses shown in curve A of FIG. 3.

As shown in curve S1 of FIG. 3 the input sginal goes to a negative potential V1− at the time that the second pulse shown in curve A of FIG. 3 is terminated. This causes the voltage at the point B at the base of the transistor Q1 to be driven negatively thereby overcoming the bias potential B+ and prohibiting the transistor Q1 from being gated on under these conditions. Thus the output transistor Q3 is also not gated on no positive output pulse is supplied from the transistor Q3 with the negative input voltage V1− supplied to the amplifier. However referring to curve F of FIG. 3, the waveform thereof is driven negatively by the summation of the negative input voltage V1− and the negative bias voltage B− so that the transistor Q2 is driven into conduction during the time period that the voltage at point F is negative. In response to the conduction of the transistor Q2, the output transistor Q4 is gated on to produce a negative output pulse as shown in curve G of FIG. 3 of the time duration dependent upon the time that the waveform of curve F of FIG. 3 is negative.

Negative pulses will continue to be applied to the load impedance Z as long as the negative input voltages V1− is applied to the amplifier. It should be noted that the pulse shown in curve G of FIG. 3 is double edge modulated according to the time duration that the waveform F is negative under the influence of the negative input voltage V1−, the negative bias voltage B− and the positive modulating signal shown in curve E of FIG. 3. The composite output signals for the input signals as shown in curve S1 of FIG. 3 is shown in curve H of FIG. 3, and substantially reconstructs the input signals at an amplified output level.

In summary, the PWM amplifier described herein thus provides an amplified PWM output of the input signals applied thereto reconstructing the input signals by double edge modulation.

Although the present invention has been described with a certain degree of particularity, it should be understood that the present disclosure has been made only by way of example and that numerous changes in the details of circuitry and the combination arrangement of parts, elements and components can be resorted to without departing from the spirit and scope of the present invention.

I claim as my invention:

1. A pulse width modulated amplifier operative with input signals comprising:

sawtooth means for providing modulating signals having a sawtooth waveform alternating about a reference potential;

first means for providing first reference signals in response to clamping said modulating signals to said reference potential and permitting excursions thereof in only one polarity;

second means for providing second reference signals in response to clamping said modulating signals to said reference level and permitting excursions thereof only in the opposite polarity from said first reference signals;

third means for providing first and second biasing signals;

first channel means for providing first control signals whose time duration is dependent upon the comparison of said input and said first biasing signals with said first reference signals;

second channel means for providing second control signals whose time duration is dependent upon the comparison of said input and said second biasing signals with said second reference signals; and output means for providing output signals to a load including first and second switching devices in response to the duration of said first and second control signals, respectively, said first and second biasing signals being selected to provide a relatively small duty cycle of operation of said first and second switching devices in the absence of input signals being supplied to said amplifier to effect thereby class A-B operation of said amplifier.

2. The amplifier of claim 1 wherein:

said first biasing signals and said first reference signals being of opposite polarities, and said second biasing signals and said second reference signals being of opposite polarities.

3. The amplifier of claim 2 wherein:

said first means comprising a negative clamp circuit to clamp said modulating signals to said reference level and permit only negative excursions thereof, said second means comprising a positive clamp circuit to clamp said modulating signals to said reference level and permit only positive excursions thereof.

4. The amplifier of claim 3 wherein:

said first biasing signals having a positive polarity and said second biasing signals having a negative polarity, the duration of said first control signals being dependent upon the time that the sum of said input signals and said first biasing signals is more positive than the negative going said first reference signals, the duration of said second control signals being dependent upon the time that the sum of said input signals and said second biasing signals is more negative than the positive going said second reference signals.

5. The amplifier of claim 4 wherein:

said switching devices including output and control electrodes, said load being operatively connected to an output electrode of each of said devices to permit the bilateral translation of current therethrough, said first and second control signals being applied to the respective control electrodes of said devices to control the switching action thereof.

References Cited

UNITED STATES PATENTS

| | | | |
|---|---|---|---|
| 2,490,026 | 12/1949 | Buckbee | 332—15 |
| 2,990,516 | 6/1961 | Johannessen | 332—15X |
| 3,090,929 | 5/1963 | Thompson | 332—9T |
| 3,371,291 | 2/1968 | Forrest et al. | 332—9X |
| 3,112,365 | 11/1963 | Kihara | 330—10X |

ALFRED L. BRODY, Primary Examiner

U.S. Cl. X.R.

307—265; 328—58; 330—10; 332—15